United States Patent [19]
Rutter

[11] 4,419,744
[45] Dec. 6, 1983

[54] NON-VOLATILE STATIC RAM ELEMENT
[75] Inventor: Phillip Rutter, Plymstock, England
[73] Assignee: Plessey Overseas Limited, Ilford, England
[21] Appl. No.: 294,358
[22] Filed: Aug. 19, 1981
[30] Foreign Application Priority Data
  Jan. 9, 1981 [GB] United Kingdom ............... 8100592
[51] Int. Cl.³ ............................................ G11C 11/40
[52] U.S. Cl. .................................. 365/154; 365/230
[58] Field of Search ............... 365/154, 174, 189, 230
[56] References Cited
  U.S. PATENT DOCUMENTS
  4,349,894 9/1982 Cauder ............................... 365/154

Primary Examiner—Terrell W. Fears
Attorney, Agent, or Firm—Fleit, Jacobson, Cohn & Price

[57] ABSTRACT

This application describes a non-volatile static ram element. The element includes a pair of field effect transistors T1 and T2 whose drain and gate electrodes are cross coupled to form a flip-flop circuit and a non-volatile semiconductor memory element D1, D2 is connected between the drain electrode of each transistor and a reference potential. Data may be retained in the semiconductor memory element independently of normal operation of the flip flop and true data may be returned to the ram element at any convenient time. The ram element therefore operates as a true non-volatile static ram element.

21 Claims, 10 Drawing Figures

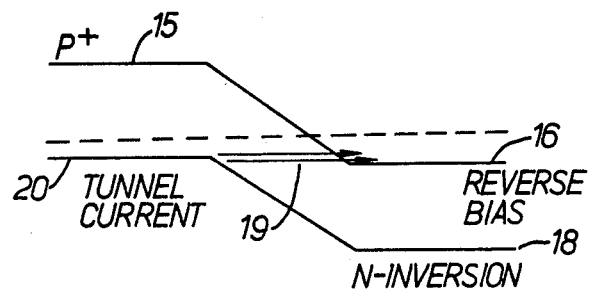
Fig. 4.
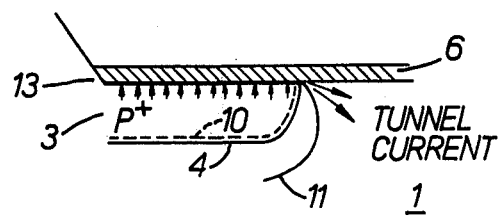
Fig. 5.
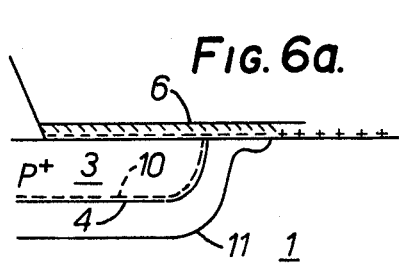 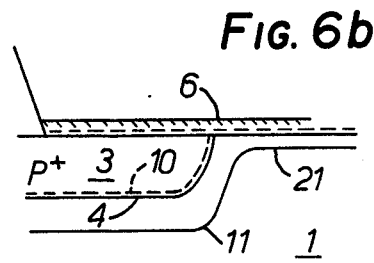
Fig. 6a.  Fig. 6b

NON-VOLATILE STATIC RAM ELEMENT

United Kingdom patent application No. 8009223 describes a semiconductor memory element of relatively high packing density and utilising relatively simple non-epitaxially isolated technology.

This invention seeks to provide a non-volatile static random access memory (ram) element in which the memory element of the above patent application is utilised.

According to this invention there is provided a random access memory element comprising a pair of field effect transistors having source electrodes coupled to a reference potential and each having a drain electrode cross coupled to the gate electrode of the other transistor to form a flip-flop circuit; a load coupled to each field effect transistor; a semiconductor memory element coupled between the drain electrode of each transistor and a reference potential and wherein each memory element comprises a semiconductor substrate having a region of a first conductivity type provided with a diffused region of opposite conductivity type; a charge trapping dielectric layer overlying a surface portion of each of the diffused region and the region of first conductivity type; a gate electrode overlying the charge trapping dielectric layer and wherein the diffused region has a surface doping concentration such that the surface portion of the diffused region inverts in conductivity type when a predetermined amount of charge of a suitable polarity is trapped in the charge trapping dielectric layer and the concentration of charge of opposite polarity attracted to the inverted region approaches degeneracy.

Typically the surface doping concentration of the diffused region is greater than $10^{18} cm^{-3}$.

The charge trapping dielectric layer may overlie each surface portion via an intermediate dielectric layer.

The substrate material may be silicon and the charge trapping dielectric layer and the intermediate dielectric layer may be silicon nitride and silicon oxide respectively.

The gate electrode of each memory element may be coupled to the reference potential whilst the diffused region of each element is connected to the drain electrode of a respective transistor.

A pair of access transistors may be provided each having a source electrode coupled to a respective input terminal, a drain electrode coupled to the drain electrode of a respective one of the pair of field effect transistors and a gate electrode coupled to a reference potential.

The gate electrode of each memory element may be coupled to the gate electrode of a respective one of the access transistors.

Each load may be formed by a further field effect transistor and each further field effect transistor may be a depletion mode transistor.

An exemplary embodiment of the invention will now be described with reference to the drawings in which;

FIG. 4 shows a band structure diagram for the written structure of FIG. 3;

FIG. 5 illustrates schematically the flow of tunnel current during the reading of a written element illustrated in FIG. 3;

FIG. 6a and 6b illustrate alternative methods of erasing a written element;

Figure 1A:
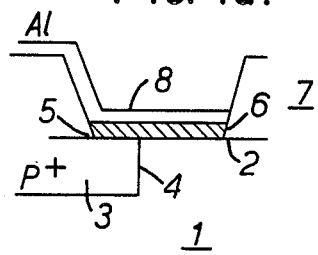
FIGS. 1a and 1b illustrate alternative embodiments of a P-channel semiconductor memory element which forms part of a random access memory element in accordance with the present invention.

Referring to FIG. 1a there is shown a P-channel version of a semiconductor memory element which forms part of a ram element of this invention the memory element comprising an N type silicon semiconductor substrate generally referenced 1 having a surface 2 into which is diffused a P type region 3. The diffused region 3 has a boundary edge 4 which extends to the surface 2 of the substrate 1.

A thin layer 5 of silicon oxide is formed on the surface 2 so as to overlie a portion of the surface 2 of the substrate 1 and a surface portion of the diffused region 3. The oxide therefore crosses the boundary region 4 between the diffused regions 3 and the remaining portion of the substrate 1. A layer of silicon nitride which is a charge trapping dielectric material is formed on the oxide layer 5 and therefore also overlies surface portions of both the P type diffused region 3 and the N type substrate 1. Remaining surface portions of the P type diffused region 3 and N type substrate 1 are protected protected by a thick layer of silicon oxide 7.

Electrical contact is made to the silicon nitride layer 6 by means of an aluminium contact layer 8 which also extends partly over the thick oxide layer 7. The diffused region 3, the oxide and nitride layers 5 and 6 respectively and the aluminium layer 8 are formed by well known semiconductor processing techniques including photolithographic masking and etching.

In operation of the memory element a negative voltage may be applied to the aluminium gate 8 relative to the diffused region 3, a suitable value being of the order of 40 volts. The application of this negative potential to the gate 8 causes a significant quantity of positive charge to be trapped in charge trapping sites in the silicon nitride dielectric layer 6. This action is similar to that in known MNOS transistor memory elements but in the present invention the diffused region 3 has a surface doping concentration such that the charge trapped in the nitride layer 6 attaches a sufficiently large number of charges of opposite polarity to the surface of the P type diffused region 3, that this surface region inverts and becomes N type forming a PN junction at the surface of the diffused region 3.

To effect this invention the doping concentration at the surface of the diffused region 3 must be such that the attracted charged concentration approaches degeneracy. To achieve this action a typical doping concentration of greater than $10^{18}$ carriers per cubic centimetre is required. In this state the memory element is referred to as being written and the state will be retained due to the retention of the trapped charge in the nitride layer 6 after removal of the initial negative voltage applied to the gate electrode 8.

Figure 1B:
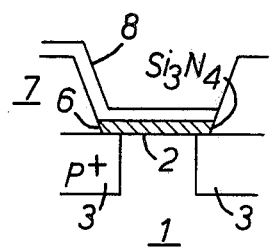

Referring now to FIG. 1b where like parts to those in FIG. 1a bear like reference numerals, the only essential difference is that the diffused region 3 is now provided in the shape of an annular ring, the silicon nitride layer 6 now being provided to overlie the surface 2 in the centre of the annular ring and to extend to overlap the surface of the P type diffused region 3.

Figure 2:
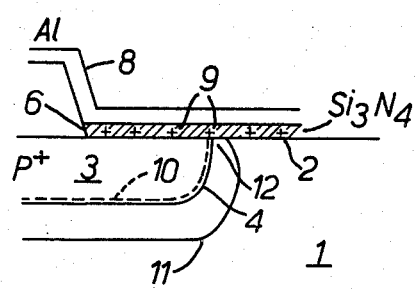
FIG. 2 illustrates the out of fabrication charge structure of the memory element of FIG. 1.
Figure 3:
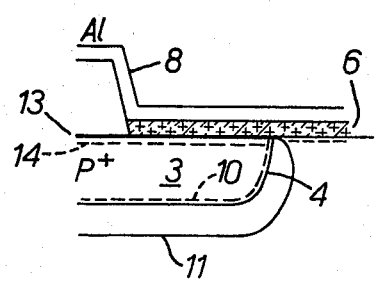
FIG. 3 illustrates the written charge structure of the element of FIG. 1.

Referring now to FIGS. 2 and 3 these illustrate charge structures for the memory element in the out of fabrication, that is as manufactured but before writing, and the written element respectively.

In FIG. 2, the device as fabricated contains a small amount of trapped positive charge 9 within the silicon nitride layer 6 but this is insufficient to cause any inversion of the surface of the P type diffused region 3. The physical boundary within the substrate 1 of the diffused region 3 is illustrated at 4 and on each side of this boundary extends a depletion region, the edge of which in the diffused region 3 is indicated by the dashed line 10. The depletion edge in the substrate 1 is indicated by the solid line 11. As can be seen, where the depletion region boundary 11 approaches the surface 2 of the substrate 1 the surface width 12 of the depletion region is slightly pinched.

In FIG. 3 the memory element is in the written state with a large amount of trapped positive charge within the silicon nitride dielectric layer 6. As indicated previously this trapped charge is sufficient in view of the surface doping concentration within the diffused region 3, to cause an N type inversion layer 13 to be formed at the surface of the P type diffused region 3. This inverted region 13 forms a PN diode with the P type diffused substrate 3 and a further depletion region having a boundary 14 is formed at this PN junction.

Referring now to FIG. 4 this shows a band structure diagram for the PN diode formed by the diffused region 3 and the surface inversion region 13 in a written memory element.

The band 15 represents the donor band for the P type diffused region 3 whilst the band 16 represents the donor band for the inverted region 13. The band 17 represents the acceptor band for the diffused region 3 whilst the band 18 represents the acceptor band for the inverted region 13.

Under conditions of slight reverse bias of the PN diode formed after inversion a tunnel current can flow through the depletion region before the diode breaks down and this is illustrated by the arrows 19.

The flow of tunnel current is illustrated schematically for the memory element structure shown in FIG. 6 and as can be seen this flows from the diffused region 3 across the depletion region into the inverted region 13 and into the substrate 1.

As will be explained later in order to read a written device the flow of tunnel current before avalanche breakdown under slight reverse bias conditions is sensed.

In order to erase a written device it is necessary to disperse the charge which is trapped and stored in the silicon nitride layer and this is illustrated in diagrams (a) and (b) of FIG. 6 which respectively show alternative ways of performing this erasure.

In the first method illustrated in FIG. 6a a large negative voltage typically 40 volts or more is applied to the diffused region 3 relative to the gate electrode 8 and the substrate 1. This causes the boundary 11 of the depletion region within the substrate 1 to expand outwardly at 20 thereby causing the trapped charge within the silicon nitride layer 6 also to move outwardly and to disperse into the substrate 1.

In FIG. 6b a positive voltage is applied to the gate electrode 8 of the silicon nitride layer 6 and this causes a uniform outward spreading of the depletion region edge 11, as illustrated at 21 and a corresponding uniform spreading of the charge stored in the silicon nitride dielectric layer 6. This charge once again decays into the substrate 1.

Figure 7:
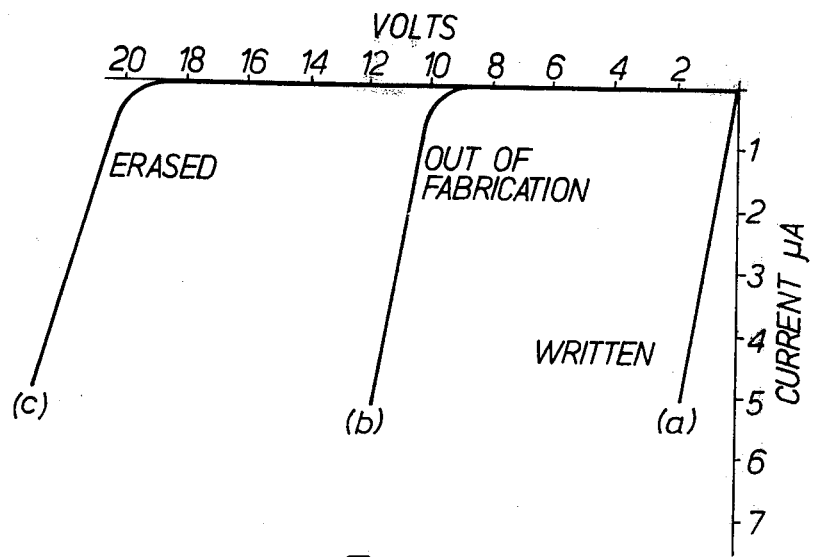
FIG. 7 illustrates current voltage characteristics for the element in various states; and, FIG. 8 shows an N-channel embodiment of a random access memory element in accordance with the present invention.

Referring now to FIG. 7 there are shown characteristic curves of the memory element illustrating the flow of current from the diffused region 3 to the substrate 1 in dependence upon the value of the voltage applied to the diffused region 3 for each of three states of the memory element, these states being the written state illustrated in curve (a), the out-of-fabrication state illustrated in curve (b) and the erased state illustrated in curve (c).

The above described semiconductor memory element is implemented in P-channel technology but may equally well be implemented in N-channel which has the advantage of allowing lower operating voltages.

Figure 8:
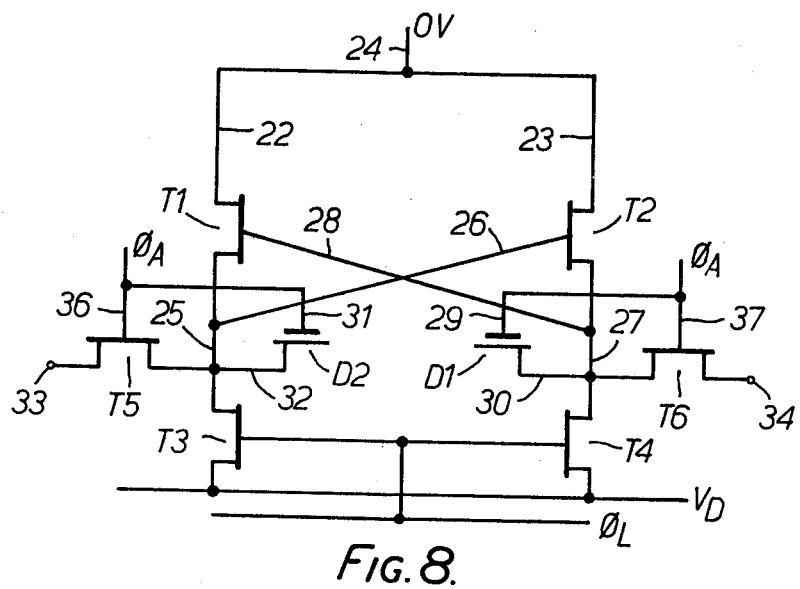

Referring now to FIG. 8 of the drawings there is shown an N-channel static ram memory element in accordance with the present invention. In this Figure a pair of field effect transistors T1 and T2 have respective source electrodes 22 and 23 coupled together and to a reference potential 24 which in the present example of N channel field effect transistors is earth reference potential. The field effect transistor T1 has a drain electrode 25 which is cross coupled to a gate electrode 26 of the transistor T2 and in similar manner the transistor T2 has a drain electrode 27 which is cross coupled to a gate electrode 28 of the transistor T1 so that the transistors T1 and T2 for a flip-flop circuit. The drain electrodes 25 and 27 of the transistors T1 and T2 respectively are coupled to a reference potential $V_D$ via field effect load transistors T3 and T4 respectively whose gate electrodes are coupled together and to a source of potential $\phi_L$.

A semiconductor memory element D1 as described above is connected between the drain electrode 27 and the gate electrode 37 of an access transistor T6. A gate electrode 29 of the element D1 is connected to a gate electrode 37 of the access transistor T6 whilst the element also has a diffused region 30 which is coupled to the drain electrode 27 of the transistor T2. A similar memory element T2 is connected between the gate electrode 36 of an access transistor T5 and the drain electrode 25 of the transistor T1 the gate electrode 36 of the transistor T5 being connected to gate electrode 31 of the element D2 whilst the drain electrode 25 of the transistors T1 is connected to the diffused region 32 of the element D2.

Access for data storage to the random access memory element is made by the access transistors T5 and T6 which have source electrodes coupled to data input terminals 33 and 34 respectively. An access potential $\phi_A$ is fed to the gate electrodes 35 and 36 of the access transistors T5 and T6 respectively.

In normal operation with power applied to the ram element the potentials $\phi_L$ and $V_D$ are set at typically 5 volts and the access potential $\phi_A$ applied to the access transistors T5 and T6 is also 5 volts. Under these conditions the element illustrated operates as a conventional static latch random access memory element as follows.

Assume that to store a logical "0" data bit the drain electrode of the access transistor T5 is held at a high potential whilst the drain electrode of the transistor T6 is low. The opposite conditions will apply for a logical "1" data bit. The load transistors T3 and T4 are both switched on by the application of the potential $\phi_L$.

Under these conditions the transistor T1 will be switched off whilst T2 is on and the conduction of the transistor T2 will maintain the source electrode of the transistor T4 which is coupled to the drain 27 of the transistor T2 at a similarly low potential, this potential being that applied at the terminal 24. The source electrode of the transistor T3 will be pulled to a relatively high potential since the transistor T1 is switched off. The ram element will therefore be latched with the transistor T1 off and the transistor T2 on.

This latching operation of the ram element will not be affected by the presence of the semiconductor memory elements D1 and D2 since the maximum potential which can appear between the gate electrode and diffusion of either of these elements is of the order of 5 volts and this is insufficient to transform either element into the written state.

After the latching the access potential $\phi_A$ may be returned to OV.

When power is to be removed from the ram element and it is desired to achieve non-volatile storage for recovery of data on restoration of the power, the potentials $V_D$ and $\phi_L$ are taken to a larger potential suitable for writing the memory elements D1 and D2. This potential may be typically between 15 and 20 volts.

When these higher potentials are applied the transistors T3 and T4 will turn even harder on and since the ram element is already latched with the transistor T1 turned off and the transistor T2 on the drain electrode of the transistor T1 will move to the new higher potential whilst the drain electrode of the transistor T2 will remain low.

Under these conditions the gate electrode of the semiconductor memory element D1 will be at OV whilst its diffusion electrode 30 coupled to the drain electrode 27 of the transistor T2 will also be low so that no potential will be applied across the semiconductor memory element D1.

In respect of the element D2 its gate electrode 31 will be at the low potential whilst its diffusion electrode 32 will be at the high potential of the drain electrode 25 of the transistor T1. These are the required conditions to erase the element D2.

The potential $Q_A$ is now brought to the high value of 15-20 volts and this full potential is applied to the gate electrode of the element D1 and appears across the element which will therefore be written. The element D2 will have no potential applied across it and will remain erased. Data is thus stored in D1 and D2 when power is now removed.

When power is reapplied the transistors T5 and T6 are maintained turned off whilst the potential $\phi_L$ is returned to the previous lower level, that is approximately 5 volts. The memory element D1 which was in the written state will pass tunnel current in the manner described previously for the memory element. The transistor T4 starts to turn on and the node formed by the junction of the drain electrode 27 of the transistor T2 and the diffusion electrode 30 of the element D1 stays close to zero volts due to the flow of current through D1 and the subsequent turning on of the transistor T4.

The node formed by the junction of the drain electrode 25 of the transistor T1 and the diffusion electrode 32 of the memory element D2 does not sink tunnel current since the element D2 was erased and this node therefore follows the applied potential via the transistor T3 and goes high.

The states of the drain electrodes 25 and 27 of the transistors T1 and T2 respectively are therefore as they were before power was removed and when the transistor T2 turns on, latching of the random access memory element is completed with real data rather than inverted data returned. The random access memory element may now be operated as before as a known static latch via the access transistors T5 and T6.

The invention has been described by way of example only and modifications may be made without departing from the scope of the present invention. In particular although the RAM element of the invention has been described with respect to N channel technology it is equally applicable to P channel technology. In addition the transistors T1, T2, T3 and T4 may be either enhancement or depletion mode transistors. Although the semiconductor memory elements D1 and D2 forming part of this invention have been described in MNOS form this is not essential and any suitable material may be used to form the charge trapping dielectric layer of these elements.

The potential values are given by way of example, the particular values being dependent upon the thickness of the dielectric layers of the semiconductor memory elements D1 and D2.

What we claim is:

1. A random access memory element comprising a pair of field effect transistors having source electrodes coupled to a reference potential and each having a drain electrode cross coupled to the gate electrode of the other transistor to form a flip-flop circuit; a load coupled to each field effect transistor; a semiconductor memory element coupled between the drain electrode of each transistor and a reference potential and wherein each memory element comprises a semiconductor substrate having a region of a first conductivity type provided with a diffused region of opposite conductivity type; a charge trapping dielectric layer overlying a surface portion of each of the diffused region and the region of first conductivity type; a gate electrode overlying the charge trapping dielectric layer and wherein the diffused region has a surface doping concentration such that the surface portion of the diffused region inverts in conductivity type when a predetermined amount of charge of a suitable polarity is trapped in the charge trapping dielectric layer and the concentration of charge of opposite polarity attracted to the inverted region approaches degeneracy.

2. A random access memory element as claimed in claim 1 in which the surface doping concentration of the diffused region is greater than $10^{18} cm^{-3}$.

3. A random access memory element as claimed in claim 1 in which the charge trapping dielectric layer overlies each surface portion via an intermediate dielectric layer.

4. A random access memory element as claimed in claim 1 in which the substrate material is silicon and the charge trapping dielectric layer and the intermediate dielectric layer are silicon nitride and silicon oxide respectively.

5. A random access memory element as claimed in claim 1 in which the gate electrode of each memory element is coupled to the reference potential whilst the diffused region of each element is connected to the drain electrode of a respective transistor.

6. A random access memory element as claimed in claim 1 in which a pair of access transistors is provided each having a source electrode coupled to a respective input terminal, a drain electrode coupled to the drain electrode of a respective one of the pair of field effect transistors and a gate electrode coupled to a reference potential.

7. A random access memory element as claimed in claim 6 in which the gate electrode of each memory element is coupled to the gate electrode of a respective one of the access transistors.

8. A random access memory element as claimed in claim 1 in which each load is formed by a further field effect transistor.

9. A random access memory element as claimed in claim 8 in which each further field effect transistor is a depletion mode transistor.

10. A random access memory element as claimed in claim 2 in which the substrate material is silicon and the charge trapping dielectric layer and the intermediate dielectric layer are silicon nitride and silicon oxide, respectively.

11. A random access memory element as claimed in claim 2 in which the gate electrode of each memory element is coupled to the reference potential whilst the diffused region of each element is connected to the drain electrode of a respective transistor.

12. A random access memory element as claimed in claim 2 in which a pair of access transistors is provided each having a source electrode coupled to a respective input terminal, a drain electrode coupled to the drain electrode of a respective one of the pair of field effect transistors and a gate electrode coupled to a reference potential.

13. A random access memory element as claimed in claim 2 in which the gate electrode of each memory element is coupled to the gate electrode of a respective one of the access transistors.

14. A random access memory element as claimed in claim 2 in which each load is formed by a further field effect transistor.

15. A random access memory element as claimed in claim 14 in which each further field effect transistor is a depletion mode transistor.

16. A random access memory element as claimed in claim 3 in which the substrate material is silicon and the charge trapping dielectric layer and the intermediate dielectric layer are silicon nitride and silicon oxide, respectively.

17. A random access memory element as claimed in claim 2 in which the gate electrode of each memory element is coupled to the reference potential whilst the diffused region of each element is connected to the drain electrode of a respective transistor.

18. A random access memory element as claimed in claim 2 in which a pair of access transistors is provided each having a source electrode coupled to a respective input terminal, a drain electrode coupled to the drain electrode of a respective one of the pair of field effect transistors and a gate electrode coupled to a reference potential.

19. A random access memory element as claimed in claim 18 in which the gate electrode of each memory element is coupled to the gate electrode of a respective one of the access transistors.

20. A random access memory element as claimed in claim 3 in which each load is formed by a further field effect transistor.

21. A random access memory element as claimed in claim 20 in which each further field effect transistor is a depletion mode transistor.

* * * * *